United States Patent
Weiblen et al.

(10) Patent No.: US 6,711,033 B2
(45) Date of Patent: Mar. 23, 2004

(54) SEALED HOUSING FOR AN ELECTRONIC DEVICE AND THE RESPECTIVE SEAL

(75) Inventors: Kurt Weiblen, Metzingen (DE); Frieder Haag, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/041,352

(22) Filed: Jan. 8, 2002

(65) Prior Publication Data

US 2002/0181220 A1 Dec. 5, 2002

(30) Foreign Application Priority Data

Jan. 8, 2001 (DE) .......................... 101 00 421

(51) Int. Cl.[7] .............................. H05K 9/00; H05K 5/06
(52) U.S. Cl. ..................... 361/816; 361/752; 174/35 R; 174/35 GC
(58) Field of Search .................. 361/800, 816, 361/818, 752; 174/35 R, 35 GC, 35 MS

(56) References Cited

U.S. PATENT DOCUMENTS

| | | | | |
|---|---|---|---|---|
| 2,604,507 A | * | 7/1952 | Tyson | ................. 174/35 GC |
| 3,019,281 A | * | 1/1962 | Hartwell | ................. 174/35 GC |
| 4,507,359 A | * | 3/1985 | Powers, Jr. | ................. 428/328 |
| 4,932,673 A | * | 6/1990 | Domnikov et al. | ......... 277/608 |
| 5,031,076 A | * | 7/1991 | Kiku | ......................... 361/816 |
| 5,181,626 A | * | 1/1993 | Daenen et al. | ............. 220/282 |
| 5,548,083 A | * | 8/1996 | Yamamoto | ............. 174/35 GC |
| 5,825,634 A | * | 10/1998 | Moorehead, Jr. | ........... 361/816 |
| 5,847,317 A | * | 12/1998 | Phelps | ...................... 174/35 R |
| 5,867,371 A | * | 2/1999 | Denzene et al. | ............ 361/816 |
| 6,090,728 A | * | 7/2000 | Yenni, Jr. et al. | ........... 438/714 |

* cited by examiner

Primary Examiner—Jayprakash N. Gandhi
(74) Attorney, Agent, or Firm—Kenyon & Kenyon

(57) ABSTRACT

A sealed housing for an electronic device has a housing bottom part which has a first contact surface; a housing top part which has a second contact surface; the housing bottom part being connectable to the housing top part; and a seal which is insertable between the housing bottom part and the housing top part so that it contacts the first contact surface and the second contact surface to form a seal when the housing bottom part and the housing top part are joined. The seal is in the form of a continuous disk.

18 Claims, 1 Drawing Sheet

PRIOR ART

SEALED HOUSING FOR AN ELECTRONIC DEVICE AND THE RESPECTIVE SEAL

FIELD OF THE INVENTION

The present invention relates to a sealed housing for an electronic device having a housing bottom part which has a first contact surface, a housing top part which has a second contact surface, the housing bottom part being connectable to the housing top part; and a seal which can be placed between the housing bottom part and the housing top part in such a way that it contacts the first contact surface and the second contact surface to form a seal when the housing bottom part and housing top part are joined together. The present invention also relates to a respective seal.

BACKGROUND INFORMATION

Although it can also be applied to any desired sealed electronic housing, the present invention as well as the problems on which it is based are explained here with respect to a sealed electronic housing onboard an automobile.

FIG. 2 shows a schematic cross-sectional diagram of a known sealed electronic housing.

FIG. 2 shows a pan-shaped housing bottom part 1a accommodating a circuit board 3 having an electronic circuit, circuit board 3 being secured by mounting pins 2 in a known manner.

Housing bottom part 1a has an upper peripheral edge 10 which provides a sealing surface for a sealing ring 3.

A housing top part 1b in the form of a cover having a second contact surface 11 on which sealing ring 3 may be placed is mountable on housing bottom part 1a. Cover 1b is rounded at the edge and contacts housing bottom part 1a at its ends. At this point, it is possible for housing top part 1b to be clamped to housing bottom part 1a, as is also known in the related art.

With such a known, two-part, sealed electronic housing, sealing ring 3 is used to protect the electronic circuit provided on circuit board 3 from environmental influences such as moisture. Seal 3 is usually designed as a sealing cord or packing ring and may be manufactured of silicone by the injection molding method, for example, and may be integrally molded on housing bottom part 1a and housing top part 1b.

In the case of an integrally molded sealing ring 3 such as that illustrated in FIG. 2, base 3a connected to second contact surface 11 is advantageously designed to be wide, but tip 3b which is connected to first contact surface 10 is designed to narrow. This yields a strong adhesion at base 3a (in the case of a seal 3, which is integrally molded on housing top part 1b and forms a seal with housing top part 1b, and a seal 3, which is integrally molded on housing bottom part 1a and forms a seal with housing bottom part 1a) and at the same time a high surface pressure is achieved on the opposite contact surface.

One disadvantage of the known sealing ring 3 has been found to be that undermigration may occur under certain environmental conditions. For example, it is known that silicone seals may show undermigration on zinc surfaces when exposed to salt fog. The silicone seal therefore loses its adhesion at the base. Since the base is shaped to be wider, this yields a lower surface pressure and therefore the electronic housing may become leaky.

SUMMARY OF THE INVENTION

The sealed electronic housing according to the present invention and the corresponding seal have the advantage over the related art that it is possible to prevent undermigration while at the same time minimizing the additional sealing material used.

Due to the design of the seal according to the present invention as a disk instead of a packing cord, the influence of adhesion of the seal on the contact surface of the base carrier can be minimized. If such a sealing disk becomes detached from the base carrier, the sealing effect is still provided by the disk itself and thus the imperviousness of the electronic housing is guaranteed even in the event of undermigration.

Thus, an idea on which the present invention is based is that the seal, which is insertable between the housing bottom part and the housing top part in such a way that it contacts the first contact surface and the second contact surface when the housing bottom part and the housing top part are joined, is in the form of a continuous disk.

According to a preferred refinement of the present invention, the seal has an essentially planar back side which contacts the second contact surface over the entire surface area.

According to another preferred refinement, the seal has a peripheral integrally molded bulge on the front side, the tip of this bulge contacting the first contact surface.

According to another preferred refinement, the housing bottom part has a pan-shaped design and the first contact surface is provided on a peripheral edge.

According to another preferred refinement, the housing top part is designed in the form of a cover, and the second contact surface is provided on the inside of the cover.

According to another preferred refinement, the first contact surface is designed in the form of a bezel.

According to another preferred refinement, the seal is designed in one piece with the housing top part.

According to another preferred refinement, the seal is integrally molded or cast onto the housing top part.

DETAILED DESCRIPTION

In the figures, the same reference numbers denote the same components or those having the same function.

Figure 1:
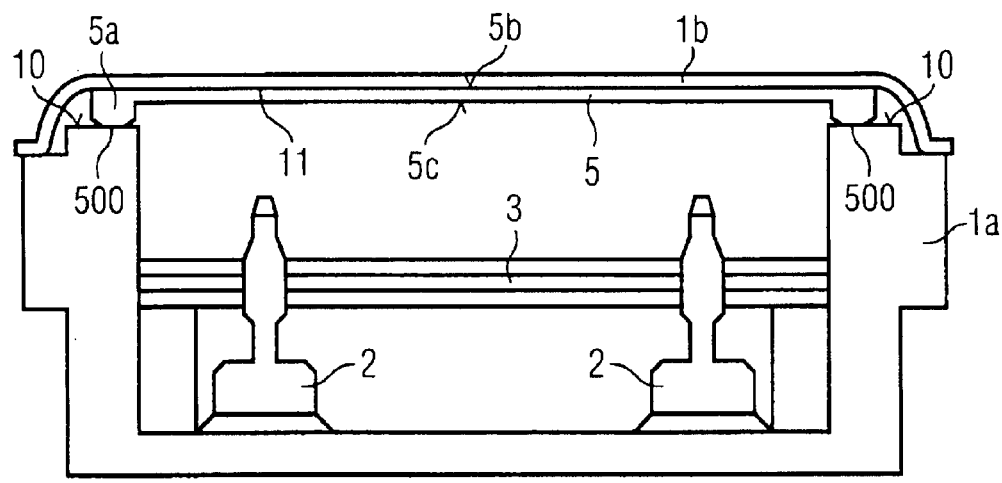
FIG. 1 shows a schematic cross-sectional diagram of a sealed electronic housing as an exemplary embodiment of the present invention.

FIG. 1 shows a schematic cross-sectional diagram of a sealed electronic housing as an embodiment of the present invention.

Figure 2:
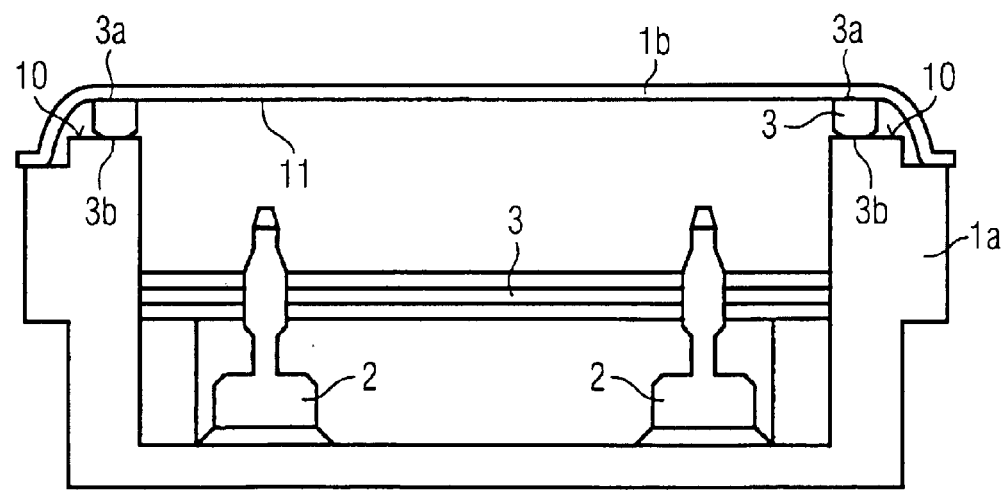
FIG. 2 shows a schematic cross-sectional drawing of a known sealed electronic housing.

Housing bottom part 1 a and its contents correspond to that already described above with reference to FIG. 2. Housing top part 1b is also identical to that already described with reference to FIG. 2.

The embodiment described here according to the present invention also provides for a modified seal 5 in comparison with the related art. This seal 5 is applied as a sealing disk which has an essentially planar back side 5b which is in full contact with second contact surface 11. On its edge, seal 5 has a peripheral bulge 5a which is pointed in the direction of first contact surface 10, so that tip 500 is in contact with first contact surface 10, forming a seal. Seal 5 may be integrally molded, cast with liquid silicone rubber or applied to housing top part 1b by some other known method.

In integral molding, the injection mold may be shaped so that seal 5 tapers downward so that the highest possible surface pressure is achieved on actual sealing surface 10.

A particular advantage of this type of production is derived from the higher cycle rates. Since it is no longer necessary to vulcanize seal 5 in a time-consuming process to achieve the highest possible adhesion, the cycle rate in production may be much higher.

Although the present invention has been described above on the basis of a preferred embodiment, it is not limited to this embodiment but instead may be modified in a variety of ways.

Another possible embodiment not illustrated here is for the seal to be cast in the housing top part and cured there.

An even greater surface pressure is possible by designing the peripheral contact surface of the housing bottom part in the form of a bezel.

What is claimed is:

1. A sealed housing for an electronic device comprising:
   a housing bottom part having a first contact surface;
   a housing top part having a second contact surface, the housing bottom part being connectable to the housing top part; and
   a seal adapted to be inserted between the housing bottom part and the housing top part such that the seal contacts the first contact surface on a first side and the second contact surface on a second side to form a seal when the housing bottom part and the housing top part are joined, the seal being in the form of a continuous disk;
   wherein the joined housing bottom part and housing top part house the electronic device in an interior thereof.

2. The sealed housing according to claim 1, wherein the seal has a substantially planar back which contacts the second contact surface over an entire surface.

3. The sealed housing according to claim 1, wherein the seal has a peripheral, integrally molded bulge on a front side, a tip of the bufge contacting the first contact surface.

4. The sealed housing according to claim 1, wherein the housing bottom part has a pan-shaped structure, the first contact surface being situated on a peripheral edge.

5. The sealed housing according to claim 1, wherein the housing top part is in the form of a cover, the second contact surface being situated on an inside of the cover.

6. The sealed housing according to claim 1, wherein the first contact surface is in the form of a bezel.

7. The sealed housing according to claim 1, wherein the seal is in one piece with the housing top part.

8. The sealed housing according to claim 1, wherein the seal is integrally molded onto the housing top part.

9. The sealed housing according to claim 8, wherein, by integral molding of the seal, an injection mold is shaped so that the seal tapers downward and a high surface pressure is achieved on a sealing surface.

10. The sealed housing according to claim 1, the seal is cast onto the housing top part.

11. The sealed housing according to claim 1, wherein the seal is integrally molded onto the housing top part by casting with a liquid silicone.

12. The sealed housing according to claim 1, further comprising a support device configured to support the electronic device in the sealed housing.

13. A seal for an electronic device comprising:
    a continuous disk;
    wherein the seal is arranged in a sealed housing configured to house an electronic device, the sealed housing including:
    a housing bottom part having a first contact surface; and
    a housing top part having a second contact surface, the housing bottom part being connectable to the housing top part and the seal is adapted to be inserted between the housing bottom part and the housing top part such that the seal contacts the first contact surface on a first side and the second contact surface on a second side to form a seal when the housing bottom part and the housing top part are joined.

14. The seal according to claim 13, further comprising:
    a substantially planar back.

15. The seal according to claim 13, further comprising:
    a peripheral integrally molded bulge situated on a front of the seal.

16. The seal according to claim 13, wherein the seal is arranged in a sealed housing for an electronic device, the sealed housing including:
    a housing bottom part having a first contact surface; and
    a housing top part having a second contact surface, the housing bottom part connectable to the housing top part, the seal insertable between the housing bottom part and the housing top part such that the seal contacts the first contact surface on a first side and the second contact surface on a second side to form a seal when the housing bottom part and the housing top part are joined.

17. The seal according to claim 13, wherein the sealed housing includes a support device configured to support the electronic device in the sealed housing.

18. A device comprising:
    an electronic device; and
    a sealed housing, the electronic device housed in the sealed housing, the sealed housing including:
    a housing bottom part having a first contact surface;
    a housing top part having a second contact surface, the housing bottom part being connectable to the housing top part; and
    a seal inserted between the housing bottom part and the housing top part such that the seal contacts the first contact surface on a first side and the second contact surface on a second side to form a seal when the housing bottom part and the housing top part are joined, the seal in the form of a continuous disk.

* * * * *

UNITED STATES PATENT AND TRADEMARK OFFICE
CERTIFICATE OF CORRECTION

PATENT NO. : 6,711,033 B2
DATED : March 23, 2004
INVENTOR(S) : Kurt Weiblen et al.

It is certified that error appears in the above-identified patent and that said Letters Patent is hereby corrected as shown below:

Column 2,
Line 54, change "bottom part 1 a" to -- bottom part 1$a$ --.

Column 3,
Line 39, change "the bufge" to -- the bulge --.

Signed and Sealed this

Twenty-sixth Day of October, 2004

JON W. DUDAS
*Director of the United States Patent and Trademark Office*